US008901601B2

(12) United States Patent
Menard et al.

(10) Patent No.: US 8,901,601 B2
(45) Date of Patent: Dec. 2, 2014

(54) VERTICAL POWER COMPONENT

(71) Applicants: STMicroelectronics (Tours) SAS, Tours (FR); Universite Francois Rabelais UFR Sciences et Techniques, Tours Cedex (FR)

(72) Inventors: Samuel Menard, Tours (FR); Yannick Hague, Mettray (FR); Gaël Gautier, Veretz (FR)

(73) Assignees: STMicroelectronics (Tours) SAS, Tours (FR); Universite Francois Rabelais UFR Sciences et Techniques, Tours Cedex (FR)

(*) Notice: Subject to any disclaimer, the term of this patent is extended or adjusted under 35 U.S.C. 154(b) by 0 days.

(21) Appl. No.: 13/774,554

(22) Filed: Feb. 22, 2013

(65) Prior Publication Data

US 2013/0228822 A1 Sep. 5, 2013

(30) Foreign Application Priority Data

Mar. 2, 2012 (FR) ...................................... 12 51947

(51) Int. Cl.
| H01L 29/74 | (2006.01) |
| H01L 31/111 | (2006.01) |
| H01L 29/06 | (2006.01) |
| H01L 29/747 | (2006.01) |
| H01L 29/66 | (2006.01) |

(52) U.S. Cl.
CPC .......... *H01L 29/747* (2013.01); *H01L 29/0649* (2013.01); *H01L 29/0661* (2013.01); *H01L 29/0638* (2013.01); *H01L 29/66386* (2013.01)
USPC ............................ 257/119; 257/130; 257/173

(58) Field of Classification Search
USPC .................................. 257/119, 173, 130, 150
See application file for complete search history.

(56) References Cited

U.S. PATENT DOCUMENTS

| 3,608,186 | A | 9/1971 | Hutson |
| 4,148,053 | A | 4/1979 | Bosselaar |
| 5,747,835 | A * | 5/1998 | Pezzani .......................... 257/113 |
| 7,968,907 | B2 * | 6/2011 | Templeton et al. ........... 257/173 |
| 2006/0138586 | A1 * | 6/2006 | Akiyama et al. .............. 257/506 |
| 2008/0038890 | A1 * | 2/2008 | Tucker .......................... 438/270 |

OTHER PUBLICATIONS

French Search Report from French Patent Application 12/51947 dated Dec. 14, 2012.
Nakajima S. et al. "An isolation technique for high speed bipolar integrated circuits", Review of the Electrical Communication Laboratories, vol. 25, No. 9-10, Sep. 1977-Oct. 1977, pp. 1039-1052.

* cited by examiner

*Primary Examiner* — Phuc Dang
(74) *Attorney, Agent, or Firm* — Allen, Dyer, Doppelt, Milbrath & Gilchrist, P.A.

(57) ABSTRACT

A vertical power component including a silicon substrate of a first conductivity type and, on the side of a lower surface supporting a single electrode, a well of the second conductivity type, in which the component periphery includes, on the lower surface side, a peripheral trench at least partially filled with a passivation and, between the well and the trench, a porous silicon insulating ring.

21 Claims, 2 Drawing Sheets

VERTICAL POWER COMPONENT

CROSS REFERENCE TO RELATED APPLICATIONS

This application claims the priority benefit of French patent application number 12/51947, filed on Mar. 2, 2012, which is hereby incorporated by reference to the maximum extent allowable by law.

BACKGROUND

1. Technical Field

The present disclosure relates to a vertical power component capable of withstanding a high voltage (for example, greater than 500 V), and more specifically relates to the peripheral structure of such a component.

2. Discussion of the Related Art

FIG. 1 is a cross-section view of a vertical power component, illustrating a way of forming the periphery of a component in so-called "planar" technology to avoid the occurrence of breakdowns at the component edges.

The component shown in this example is a triac comprising a lightly-doped N-type silicon substrate 1 ($N^-$), currently with a doping ranging from $10^{14}$ to $10^{15}$ atoms/cm$^3$, having its upper and lower surfaces comprising P-type doped wells 3 and 5 (P) extending almost over the entire surface of the component, except at the periphery thereof. Upper well 3 contains a heavily-doped N-type region 4 ($N^+$), and lower well 5 contains a heavily-doped N-type region 6 ($N^+$) in an area substantially complementary to that occupied by region 4. Upper well 3 further contains a small heavily-doped N-type region 8 ($N^+$). On the lower surface side of the component, an electrode A2 coats well 5 and region 6, and an insulating layer 11, for example, made of silicon oxide, coats the peripheral portion of the lower surface which is not covered with electrode A2. On the upper surface side of the component, an electrode A1 coats region 4 and a portion of well 3, a gate electrode G coats region 8 and a portion of well 3, and an insulating layer 9, for example, made of silicon oxide, coats the portions of the upper surface which are not covered by electrodes A1 and G. Whatever the biasing between electrodes A2 and A1, if a gate control signal is provided, the component becomes conductive. The conduction occurs from electrode A2 to electrode A1 through a vertical thyristor comprising regions 5, 1, 3, and 4, or from electrode A1 to electrode A2 through a vertical thyristor comprising regions 3, 1, 5, and 6. The thickness and the doping level of substrate 1 are calculated so that the triac, in the off state, can withstand high voltages, for example, voltages ranging between 600 and 800 volts.

To avoid that breakdowns occur at the component edges, a distance should be provided between the limit of P-type wells 3 and 5 and the component edge. In this example, to the upper and lower peripheries of the substrate are further surrounded with a heavily-doped N-type channel stop ring ($N^+$), respectively 13 and 14, which helps avoiding breakdowns at the level of the component edges.

A disadvantage of such a structure is due to the fact that the lateral surfaces of substrate 1 are not insulated. Thus, when lower electrode A2 of the component is soldered to a contact area 15 of an electronic device (metal plate of a radiator, printed circuit board, package, etc.), it is necessary to ascertain that lateral wickings 16 do not electrically connect electrode A2 to substrate 1, which would short-circuit the $PN^-$ junction formed between well 5 and substrate 1. In practice, as illustrated in FIG. 1, one arranges, between electrode A2 and area 15, an intercalary conductor 17, or pedestal, of smaller surface area (in top view) than the component, to raise the component so that excess solders 16 remain contained on its lower surface side and do not creep up along its lateral walls. The provision of pedestal 17 further enables to decrease the intensity of the electric field to which insulating layer 11 is submitted, due to the strong potential difference between substrate 1 and channel stop ring 14 on the one hand, and metal contact area 15 on the other hand. A disadvantage is that the provision of pedestal 17 significantly complicates the component assembly.

FIG. 2 is a cross-section view of a vertical power component corresponding to another conventional component periphery structure in planar technology. FIG. 2 shows a triac comprising the same elements as the triac of FIG. 1. The component of FIG. 2 differs from that of FIG. 1 by the structure of its periphery. The periphery of the component of FIG. 2 is surrounded with a P-type diffused wall 21 (P) formed from the lower and upper surfaces of the substrate. On the lower surface side of the component, well 5 extends laterally all the way to diffused wall 21. On the upper surface side of the component, well 3 stops before diffused wall 21, and a heavily-doped N-type channel stop ring 23 ($N^+$) is arranged between well 3 and wall 21 and surrounds well 3. Lower electrode A2 coats the entire lower surface of the component. On the upper surface side, electrode A1 coats region 4 and a portion of well 3, gate electrode G coats region 8 and a portion of well 3, a ring-shaped electrode 24 coats channel stop ring 23, and an insulating layer 9 coats the portions of the upper surface which are not covered with the electrodes.

To avoid that breakdowns occur at the component edges, and due to the presence of channel stop ring 23, a distance should be provided between the limit of P-type well 3 and diffused wall 21.

The structure of FIG. 2 has the advantage, as compared with the structure of FIG. 1, that the lateral surfaces of substrate 1 are insulated by diffused wall 21, which prevents any risk of short-circuit between electrode A2 and substrate 1 due to possible lateral wickings on assembly of the component. It is thus not necessary to provide an intercalary conductive element between electrode A2 and contact area 15. Further, the breakdown area is transferred to the upper surface side.

However, a disadvantage of the structure of FIG. 2 is that guard distance e2 between the edge of the component and the beginning of electrode A1 or G, respectively (limit of the actual active portion of the component), is larger than guard distance e1 between the edge of the component and the beginning of electrode A1 or G, respectively, in the structure of FIG. 1. As an example, to obtain a breakdown voltage greater than 800 volts, a guard distance e2 on the order of 400 µm must be provided in the structure of FIG. 2, to be compared with a guard distance e1 on the order of 200 µm in the structure of FIG. 1. This thus decreases the available surface area for the electrodes of the component of FIG. 2; or, for given electrode surface area values, this increases the component surface area, and thus its cost.

Another disadvantage of the structure of FIG. 2 is that the forming of lateral wall 21 requires a very long (and thus expensive) step of diffusion of dopant elements from the upper and lower surfaces of the substrate (typically on the order of 250 hours for a substrate having a thickness ranging from 200 to 300 µm and a boron doping).

SUMMARY

Thus, an embodiment provides a peripheral power component structure overcoming at least some of the disadvantages of known peripheral structures.

An embodiment provides a peripheral power component structure enabling to easily assemble the component.

An embodiment provides a peripheral power component structure taking up a decreased silicon surface area as compared with structures of the type described in relation with FIG. 2.

An embodiment provides a peripheral power component structure which is faster to manufacture than structures of the type described in relation with FIG. 2.

Thus, an embodiment provides a vertical power component comprising a silicon substrate of a first conductivity type and, on the side of a lower surface supporting a single electrode, a well of the second conductivity type, in which the component periphery comprises, on the lower surface side, a peripheral trench at least partially filled with a passivation and, between the well and the trench, a porous silicon insulating ring.

According to an embodiment, the inner edge of the insulating ring is in contact with the edge of the well.

According to an embodiment, the insulating ring extends down to a depth smaller than that of the well.

According to an embodiment, the component further comprises, on the lower surface side, between the trench and the insulating ring, a heavily-doped channel stop ring of the first conductivity type.

According to an embodiment, the outer edge of the insulating ring is in contact with the inner edge of the channel stop ring.

According to an embodiment, the porous silicon insulating ring is oxidized.

According to an embodiment, the component further comprises, on its upper surface side, a well of the second conductivity type, and the component periphery comprises, on the upper surface side, a peripheral trench at least partially filled with a passivation.

According to an embodiment, the component further comprises, on its upper surface side, between the upper well and the upper trench, a second channel stop ring.

According to an embodiment, the component comprises, on its upper surface side, between the upper well and the upper trench, a second insulating porous silicon ring.

According to an embodiment, the component is a triac.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

Figure 1:
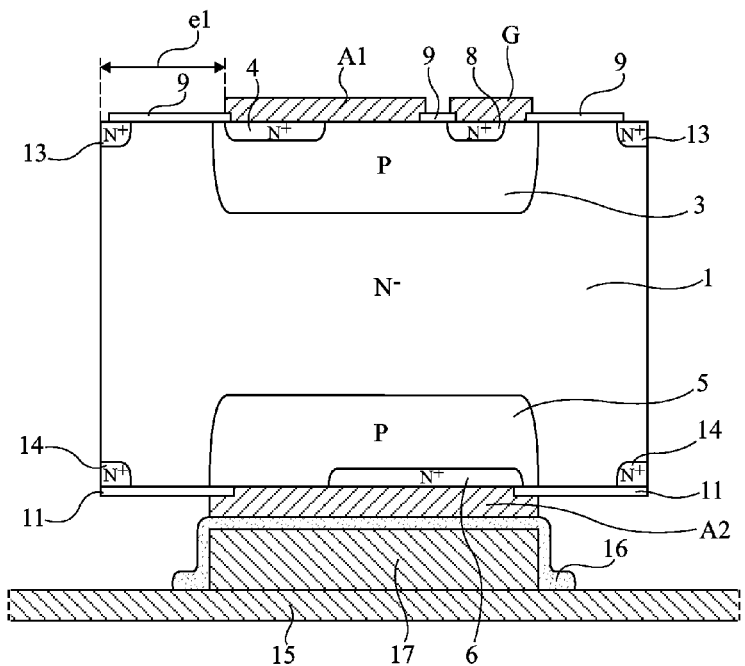
FIG. 1, previously described, is a cross-section view of a vertical power component, illustrating a way to form the periphery of a high-voltage vertical power component.
Figure 2:
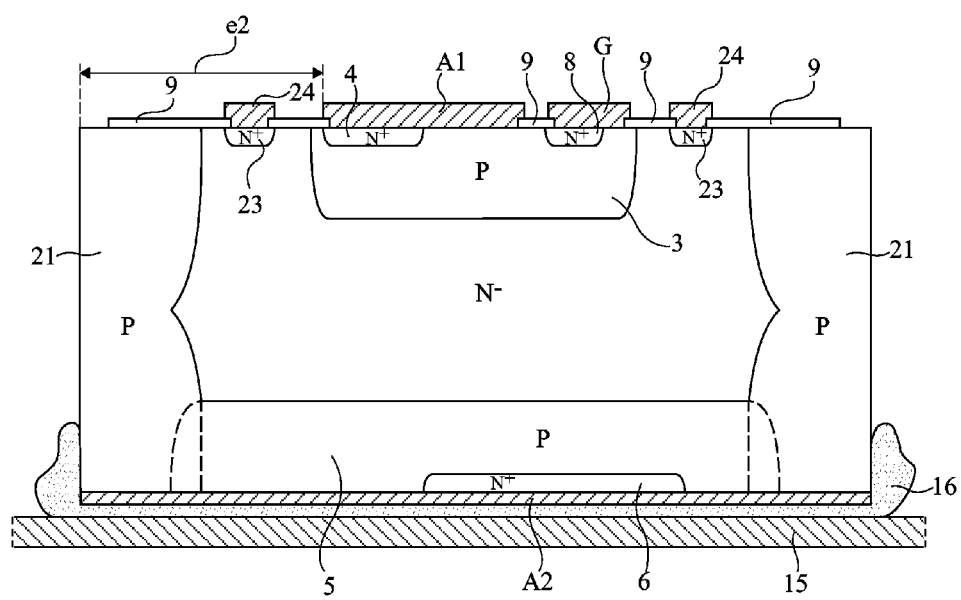
FIG. 2, previously described, is a cross-section view of a vertical power component, illustrating another way to form the periphery of a high-voltage vertical power component.
Figure 3:
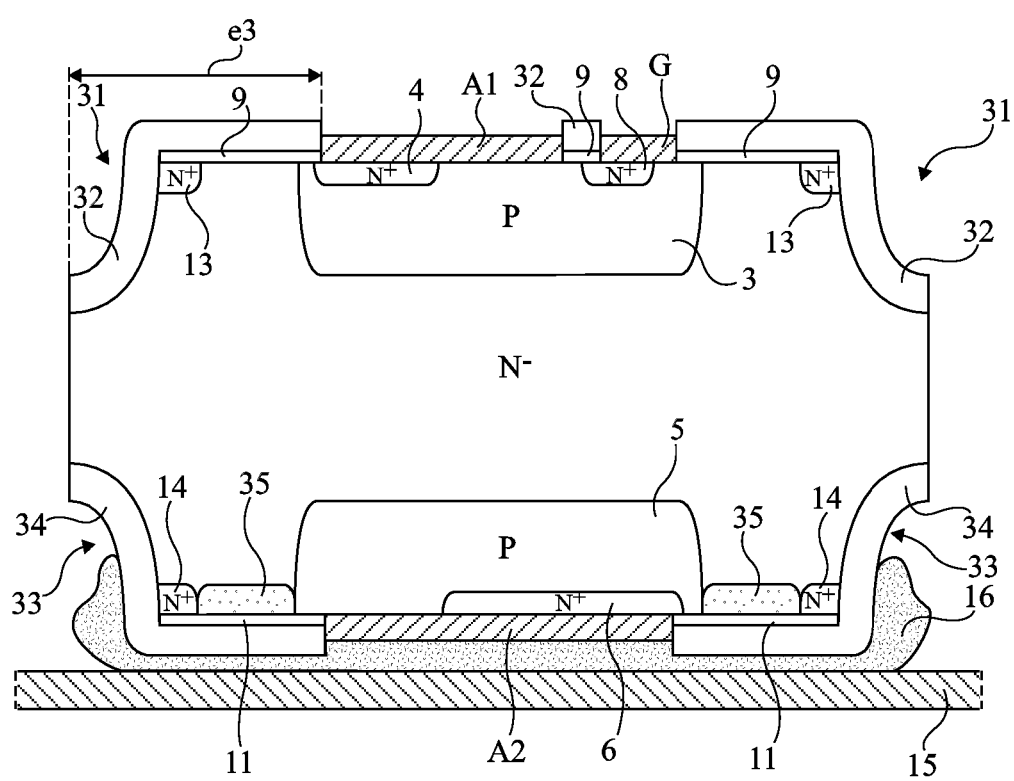
FIG. 3 is a cross-section view of a vertical power component, illustrating an embodiment of a high-voltage vertical power component peripheral structure.

FIG. 3 is a cross-section view of a high-voltage vertical power component, illustrating an embodiment of a peripheral structure enabling to avoid the occurrence of breakdowns at the component edges. FIG. 3 shows a triac comprising the same elements as the triacs of FIGS. 1 and 2. The component of FIG. 3 differs from the components of FIGS. 1 and 2 by the structure of its periphery.

In the shown example, each of the upper and lower surfaces of substrate 1, has a lateral trench, respectively 31 and 33, at least partially filled with a passivation, respectively 32 and 34, at its periphery. In this example, the walls of trenches 31 and 33 are totally coated with the passivation, without for all this being totally filled with the passivation. Passivations 32 and 34 are for example made of glass (glassivations).

Laterally, P-type wells 3 and 5 respectively stop before trenches 31 and 33. On the upper surface side of the component, the peripheral substrate region extending between well 3 and trench 31 is coated with an insulating layer 9, for example, made of silicon oxide. Insulating layer 9 is itself covered with an extension of passivation 32 above the upper surface of the substrate. On the lower surface side of the component, the peripheral substrate region extending between well 5 and trench 33 is coated with an insulating layer 11, for example, made of silicon oxide. Insulating layer 11 is itself covered with an extension of passivation 34 under the lower surface of the substrate.

On the lower surface side, electrode A2 coats P-type well 5 and N-type region 6 and forms an electric contact with these regions. On the upper surface side, electrode A1 coats region 4 and a portion of well 3 and forms an electric contact with these regions, and gate electrode G coats region 8 and a portion of well 3 and forms an electric contact with these regions.

To avoid the occurrence of breakdowns at the component edges, a distance should be provided between the limit of P-type well 3 and trench 31 on the one hand, and between the limit of P-type well 5 and trench 33 on the other hand. As in the structures of FIGS. 1 and 2, breakdowns at the component edges are mainly avoided due to the ring-shaped N-type to substrate strip surrounding the active portion of the component. Thereby, the peripheral structure of FIG. 3 is a planar-type structure. In the shown example, the upper and lower peripheries of the substrate are further surrounded with a heavily-doped N-type channel stop ring (N$^+$), respectively 13 and 14, which helps avoiding the occurrence of breakdowns at the component edges.

As illustrated in FIG. 3, lower insulating trench 33 enables to avoid, on assembly of the component onto a contact area 15 of an electronic device, for possible lateral wickings to 16 create a short-circuit between electrode A2 and substrate 1. Trench 33 should be sufficiently deep to contain possible lateral wickings 16 below the portion of the lateral surfaces of substrate 1 which are not coated with the passivation. As an example, the depth of trench 33 ranges between 40 and 100 μm. So that trench 33 can contain greater amount of solder, it is preferable for passivation 34 not to totally fill trench 33. If passivation 34 totally fills trench 33, the desired effect of insulation between the substrate and lateral wickings may still be obtained provided to provide a sufficiently deep trench.

An advantage of the structure of FIG. 3 is that guard distance e3 between the component edge and the beginning of electrode A1 or G is respectively smaller than guard distance e2 between the component edge and the beginning of electrode A1 or G, respectively, in the structure of FIG. 2. As an example, to obtain a breakdown voltage greater than 800 volts, a guard distance e2 on the order of 400 μm should be provided in the structure of FIG. 2, to be compared with a smaller guard distance e3 on the order of 300 µm, or even less in the structure of FIG. 3.

Another advantage of the structure of FIG. 3 is that its forming does not require providing a long and expensive step of diffusion of dopant elements across the entire substrate thickness.

Tests carried out by the present inventors have however shown that, once the device has been assembled on a contact area 15 of an electronic device and powered on, lower insulating layer 11 is submitted to a very strong electric field, and this more specifically near the PN junction between well 5 (P) and substrate 1 ($N^-$). This field results from the significant potential difference between area 15 and substrate 1 (for example, on the order of 800 V) and due to the fact that the distance between solder 16 and substrate 1 (approximately corresponding to the sum of the thicknesses of insulating layer 11 and passivation layer 34) is relatively small, for example, approximately ranging from 10 to 20 µm. There thus is a risk of breakdown of insulating layer 11, or, in any case, a risk of premature degradation of this layer.

As illustrated in FIG. 3, to overcome this disadvantage, one provides, on the lower surface side of the component, between P-type well 5 and trench 33, a porous silicon insulating ring 35 which surrounds well 5. Ring 35 preferably extends from the outer edge of well 5 to the inner edge of channel stop ring 14, or to trench 33 in the case where no channel stop ring is provided. Ring 35 extends from the lower surface of the substrate down to a depth ranging from a few micrometers to a few tens of micrometers, for example, ranging between 5 and 20 µm. Ring 35 forms an additional insulating thickness between solder 16 and substrate 1. The thickness (or depth) of ring 35 is preferably smaller than that of well 5. Due to the low dielectric constant of porous silicon, insulating ring 35 significantly attenuates the electric field to which insulating layer 11 is submitted. Thus, porous silicon insulating ring 35 enables to prevent the above-mentioned risks of breakdown or premature aging of layer 11. As an example, the porosity (percentage of pores) of ring 35 may range between 40% and 70%, it being understood that the higher the porosity, the greater the electric field attenuation effect. The porosity and the depth of ring 35 may be adjusted according to the targeted use.

As an example, to form the component of FIG. 3, P-type wells 3 and 5 and N-type regions 4, 6, 8, 13, and 14 are formed by diffusion from the upper and lower surfaces of a silicon wafer. Wells 3 and 5 are for example formed by diffusion of boron atoms down to a depth approximately ranging from 20 to 50 µm. Wells 4, 6, 8, 13, and 14 are for example formed by diffusion of phosphorus atoms down to a depth approximately ranging from 5 to 20 µm.

Ring-shaped region 35 is then made porous, for example, by an electrochemical dissolution method. To achieve this, the wafer may be placed in a solution base on hydrofluoric acid between two electrodes, so that a current flows between the two electrodes, through the electrolytic solution, and through ring-shaped region 35. Before the electrochemical dissolution step, a protection layer, for example, made of silicon nitride, may be formed on the wafer surfaces which are not to be put in contact with the electrolytic solution, and this protection layer may if necessary be removed afterwards. After the electrochemical dissolution step, a step of oxidation of porous silicon 35 may further be provided, which enables to improve the insulating properties of ring 35.

Insulating layers 9 and 11 and electrodes A1, G, and A2 may then be deposited on the upper and lower surfaces of the silicon wafer. Trenches 31 and 33 may then be formed between the components, and passivations 32, 34 may be deposited in the trenches and on the peripheral portions of the components. The silicon wafer may then be diced into individual to components along dicing lines following, in top view, longitudinal axes substantially running through the middle of trenches 31 and 33.

It should be noted that it is preferable to form porous silicon region 35 only after having formed the various diffused regions of the component (wells 3 and 5 and regions 4, 6, 8, 13, and 14 in this example). Indeed, if region 35 was formed before the diffused regions of the component, the various anneals of the trench, associated with the forming of the diffused regions, would risk damaging porous silicon 35.

Specific embodiments have been described. Various alterations, modifications, and improvements will readily occur to those skilled in the art.

In particular, embodiments have been described in the case where the power component is a triac. It should be understood that the like structure may apply to any other known type of vertical power component, for example, a thyristor or a mono- or bidirectional Shockley diode.

Further, the embodiments are not limited to the example of manufacturing mode mentioned hereabove to form the component, and in particular to form porous silicon ring 35. It will be within the abilities of those skilled in the art to form the provided structure by using any other known method for forming porous silicon regions in a silicon substrate, for example, chemical dissolution methods.

Further, in the example described in relation with FIG. 3, a peripheral lateral trench 31 coated with a passivation 34 is formed on the upper surface side of the component. This trench is optional. Indeed, in most cases, the problem of excess solder capable of contacting the lateral surfaces of the component is only posed on the side of the lower component electrode (electrode A2 in the shown example). It should however be noted that even when upper trenches 31 are of no use for the protection against short-circuits, it may be useful to still provide such trenches since they enable, during certain manufacturing steps, to counterbalance the mechanical stress exerted on the trench due to the presence of lower trenches 33.

Further, in the example described in relation with FIG. 3, a single porous silicon ring 35 is arranged on the lower surface side of the component. As a variation, it may be provided to arrange a second porous silicon ring on the upper surface side of the component, substantially in front of the first ring. The provision of an upper ring may especially be advantageous in the case of certain components which comprise a single electrode per surface, for example, double Shockley diodes in antiparallel. In this case, the upper electrode may indeed be connected to a large contact area (that is, having a larger surface area than the electrode), as is the case for to lower electrode A2 in the example of FIG. 3. The same problem discussed hereabove, due to the strong electric field in the area located between the contact area of the external device and substrate 1 of the component, may thus arise on the upper surface side of the component. The provision of a porous silicon insulating ring on the upper surface side of the component then enables to decrease risks of breakdown or premature aging for the upper insulating layer.

Further, the concept is not limited to the above-described embodiments where the components are attached by soldering to contact areas of an electronic device. Other attachment means may be provided, for example, conductive glues.

Further, in the above-described examples, the component is formed from an N-type substrate. The provided embodiments also apply to the case where the original substrate is a P-type substrate. In this case, all the above-described conductivity types are to be inverted.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A vertical power component comprising a silicon substrate of a first conductivity type and, on the side of a lower surface associated with a single electrode, a well of a second conductivity type, wherein the component periphery comprises, on the lower surface side, a peripheral trench at least partially filled with a passivation material and, between said well and said trench, a porous silicon insulating ring.

2. The vertical power component of claim 1, wherein the inner edge of the insulating ring is in contact with the edge of said well.

3. The vertical power component of claim 1, wherein the insulating ring extends down to a depth smaller than that of the well.

4. The vertical power component of claim 1, further comprising, on the lower surface side, between said trench and said insulating ring, a heavily-doped channel stop ring of the first conductivity type.

5. The vertical power component of claim 4, wherein the outer edge of the insulating ring is in contact with the inner edge of the channel stop ring.

6. The vertical power component of claim 1, wherein the porous silicon insulating ring is oxidized.

7. The vertical power component of claim 1, further comprising, on its upper surface side, a well of the second conductivity type, wherein the component periphery comprises, on the upper surface side, a peripheral trench at least partially filled with a passivation.

8. The vertical power component of claim 7, further comprising, on its upper surface side, between the upper well and the upper trench, a second channel stop ring.

9. The vertical power component of claim 7, further comprising, on its upper surface side, between the upper well and the upper trench, a second porous silicon insulating ring.

10. The vertical power component of claim 1, forming a triac.

11. A vertical power component comprising a substrate of a first conductivity type and, on a first surface associated with an electrode, a well of a second conductivity type, wherein the component periphery comprises, on the first surface, a peripheral trench at least partially filled with a passivation material and, between said well and said trench, a porous silicon insulating ring.

12. The vertical power component of claim 11, wherein the inner edge of the insulating ring is in contact with the edge of said well.

13. The vertical power component of claim 11, wherein the insulating ring extends down to a depth smaller than that of the well.

14. The vertical power component of claim 11, further comprising, on the lower surface side, between said trench and said insulating ring, a heavily-doped channel stop ring of the first conductivity type.

15. The vertical power component of claim 14, wherein the outer edge of the insulating ring is in contact with the inner edge of the channel stop ring.

16. The vertical power component of claim 11, wherein the porous silicon insulating ring is oxidized.

17. The vertical power component of claim 11, further comprising, on an upper surface side, an upper well of the second conductivity type, wherein the component periphery comprises, on the upper surface side, an upper peripheral trench at least partially filled with a passivation.

18. The vertical power component of claim 17, further comprising, on the upper surface side, between the upper well and the upper trench, a second channel stop ring.

19. The vertical power component of claim 17, further comprising, on its upper surface side, between the upper well and the upper trench, a second porous silicon insulating ring.

20. The vertical power component of claim 11, forming a triac.

21. The vertical power component of claim 11, wherein the first surface is associated with a single electrode.

* * * * *